United States Patent
Ingerly et al.

(10) Patent No.: US 10,886,195 B2
(45) Date of Patent: Jan. 5, 2021

(54) SYSTEMS AND METHODS FOR IMPROVED THROUGH-SILICON-VIAS

(71) Applicant: INTEL CORPORATION, Santa Clara, CA (US)

(72) Inventors: Doug B. Ingerly, Portland, OR (US); Candi S. Cook, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/316,504

(22) PCT Filed: Aug. 18, 2016

(86) PCT No.: PCT/US2016/047605
§ 371 (c)(1),
(2) Date: Jan. 9, 2019

(87) PCT Pub. No.: WO2018/034667
PCT Pub. Date: Feb. 22, 2018

(65) Prior Publication Data
US 2019/0311973 A1    Oct. 10, 2019

(51) Int. Cl.
*H01L 23/48*    (2006.01)
*H01L 21/768*    (2006.01)
(Continued)

(52) U.S. Cl.
CPC ...... *H01L 23/481* (2013.01); *H01L 21/76898* (2013.01); *H01L 23/48* (2013.01);
(Continued)

(58) Field of Classification Search
CPC ..... H01L 25/50; H01L 24/16; H01L 25/0657; H01L 2224/82; H01L 23/481;
(Continued)

(56) References Cited

U.S. PATENT DOCUMENTS

2004/0238933 A1    12/2004    Chen et al.
2010/0025825 A1*    2/2010    DeGraw ........... H01L 21/76898
                                                                257/621
(Continued)

FOREIGN PATENT DOCUMENTS

KR    1020100081271 A    3/2012
KR    1020120094712 A    8/2012
WO    2016007176 A1    1/2016

OTHER PUBLICATIONS

PCT/US2016/047605, International Search Report and Written Opinion, dated May 17, 2017, 15 pages.

*Primary Examiner* — Jasmine J Clark
(74) *Attorney, Agent, or Firm* — Schwabe, Williamson & Wyatt, P.C.

(57) ABSTRACT

A semiconductor structure is described. The semiconductor structure includes a semiconductor substrate and a through-silicon via (TSV). The TSV is disposed between a first surface of the semiconductor substrate and an interconnection layer disposed on a second surface of the semiconductor substrate, where the first surface of the semiconductor substrate is opposite to the second surface. The TSV has an external surface that interfaces with the semiconductor substrate. In one embodiment, the external surface includes a protrusion that extends into the semiconductor substrate. In another embodiment, the TSV includes one or more voids. In yet another embodiment, the TSV includes both protrusions and voids. The protrusions and/or the one or more voids may reduce thermal expansion stress. Other embodiments may be described and/or claimed.

23 Claims, 10 Drawing Sheets

(51) Int. Cl.
*H01L 23/528* (2006.01)
*H01L 23/00* (2006.01)
*H01L 25/065* (2006.01)
*H01L 25/00* (2006.01)

(52) U.S. Cl.
CPC ........ *H01L 23/5283* (2013.01); *H01L 23/562* (2013.01); *H01L 24/00* (2013.01); *H01L 24/05* (2013.01); *H01L 25/0657* (2013.01); *H01L 25/50* (2013.01); H01L 24/13 (2013.01); H01L 24/16 (2013.01); H01L 2224/02372 (2013.01); H01L 2224/0401 (2013.01); H01L 2224/05548 (2013.01); H01L 2224/05572 (2013.01); H01L 2224/05647 (2013.01); H01L 2224/16145 (2013.01); H01L 2224/16227 (2013.01); H01L 2224/81192 (2013.01); H01L 2225/06513 (2013.01); H01L 2225/06517 (2013.01); H01L 2225/06544 (2013.01)

(58) Field of Classification Search
CPC ......... H01L 21/486; H01L 2225/06541; H01L 2225/06544; H01L 2225/06548; H01L 21/76898; H01L 23/49827; H01L 23/5384
See application file for complete search history.

(56) References Cited

U.S. PATENT DOCUMENTS

2012/0292746 A1* 11/2012 Lee .................. H01L 21/76898
257/621
2015/0162313 A1 6/2015 Razdan et al.

* cited by examiner

SYSTEMS AND METHODS FOR IMPROVED THROUGH-SILICON-VIAS

CROSS-REFERENCE TO RELATED APPLICATIONS

This patent application is a U.S. National Phase Application under 35 U.S.C. § 371 of International Application No. PCT/US2016/047605, filed on Aug. 18, 2016, the entire contents of which is hereby incorporated by reference herein.

TECHNICAL FIELD

The present disclosure generally relates to through-silicon-vias (TSVs). A TSV is an electrical connection that passes through a silicon wafer or die to enable interconnection of stacked die (e.g., 3D integrated circuits).

BACKGROUND INFORMATION

TSVs enable wafer/die to wafer/die communication. This allows wafers/die to be stacked vertically and packaged together in a single package. Stacked vertically, electrically connected, and packaged together wafers/die improves performance and reduces circuit size. This packaging reduces intermediate components such as circuit boards and extra packaging, which also reduces possible failure points.

Despite the many benefits of 3D integrated circuits (wafer/die stacking), 3D integrated circuits have largely been limited to memory wafer/die and similar wafer/die which use a higher-K dielectric (i.e., lower performance interconnect). These limitations are largely due to limitations of existing TSV technology and the temperature constraints associated with semiconductor processing and packaging. Accordingly, improvements are needed to expand the use of TSVs with low-K dielectrics (i.e., high performance interconnects).

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of the disclosed embodiments. However, it will be apparent to those skilled in the art having the benefit of the present disclosure that the various aspects of the embodiments may be practiced in other examples that depart from these specific details. In certain instances, descriptions of well-known devices, circuits, and methods are omitted so as not to obscure the description of the embodiments with unnecessary detail.

High performance interconnects often use low dielectric constant materials as electrical insulator material. These lower dielectric constant (e.g., low-K) materials are weak and prone to cracking under stress. Such cracks in the insulator material result in electrical and reliability failures (e.g., electrical opens, electromagnetic (EM) degradation (more than 10×), and shorts from metal migration).

The strength of the interconnect layer varies depending on the interconnect process. The stress experienced by the interconnect depends on multiple factors such as critical dimension (CD) and processing history. Two examples of how TSVs can apply to stress to the interconnect are thermal expansion mismatch between materials and physical stress from processing steps such as polish. The present systems and methods address the need to be able to contain the stress (e.g., thermal expansion stress) within the stronger Silicon (Si) rather than allowing it to be translated into the much weaker interconnect dielectric.

Reducing stress on the interconnect prevents damage to the interconnect (cracks, faults, for example). This damage includes but is not limited to: plastic deformation of the copper (Cu) lines, delamination of the dielectric materials, cracking of the dielectric materials, stress induced voiding, and compromised interfaces (leading to increased resistance and long term reliability concerns such as electro-migration, for example).

The typical solution to this issue is too use a stronger interconnect material such as $SiO_2$ or SiOF. Use of $SiO_2$ like materials (e.g., stronger dielectrics) may be common for memory interconnects which are what most TSV's are focused on. However, using the stronger dielectric material will negatively impact the Resistance/Capacitance of the interconnect (add low $K_{ref}$) which would degrade the performance for the overall product. For example, this would significantly increase capacitance (impacting Resistance*Capacitance product) of the interconnect stack. This would lead to very significant performance impacts to the performance of products and will lead to increased power use. Additionally, if strong interconnects are required TSV processing can't be moved to an existing high performance process without very significant process development and new design efforts. That is, additional changes to the TSV process could negatively impact the performance or increase processing costs. Accordingly, the use of a stronger dielectric is not suitable for high performance interconnects. The present systems and methods are targeted for high performance/low strength interconnects.

Reduction of thermal Max/Min processing would also help (because it would limit the amount of thermal expansion of the TSV, for example). However, temperature of 240° C.+ are typically required for any solder parts and any restriction below this would require non-industry standard packaging and pin/socket motherboard attaching. Additionally, low temperature temperatures limits processing options and often results in poor quality chemical vapor deposition (CVD) films, limited anneals for Cu during films, or modified Cu grain structure.

Yet another option would be to modify the critical dimensions and/or adjust the material properties within the TSV. Modeling suggests that the sheer stress profile of the TSV dramatically increases along the edges and by modifying the critical dimensions and/or adjusting material properties within the TSV the stress can be reduced and potentially eliminate the cracks. However, these modifications are difficult to integrate and can impact the electrical performance of the product. Accordingly, an alternative solution is desirable.

In the present systems and methods a different approach is utilized. The present systems and methods modify the sidewall to protrude into the Silicon, effectively increasing the strength of the TSV by using the dielectric to contain the stress. The change of the sidewall profile is transparent to the electrical properties but has the benefit of changing the stress profile; therefore, eliminating cracking at the interconnects. Additionally or alternatively, the present systems and methods add/create one or more voids into the TSV, which provide a low energy area for the flux of Cu to go to reduce the stress profile; therefore eliminating cracking at the interconnects. In some embodiments, a void could be created in the notch (e.g., protrusion). The notch and/or void allow for grain growth and provides a low energy area for the flux of Cu to reduce long term stress.

It is understood that TSV is a term of art that refers to vias that connect a front side of a semiconductor substrate with a back side of the semiconductor substrate. Although the term TSV includes the word "silicon" in the name, the term is intended to refer generally to a via that extends through a semiconductor substrate, which may be composed of materials other than silicon. For example, the semiconductor substrate may be composed of germanium (Ge), gallium arsenide (GaAs), silicon carbide (SiC), gallium nitride (GaN), gallium phosphide (GaP), cadmium sulphide (CdS), lead sulphide (PbS), and/or an alternative semiconductor material.

Figure 8:
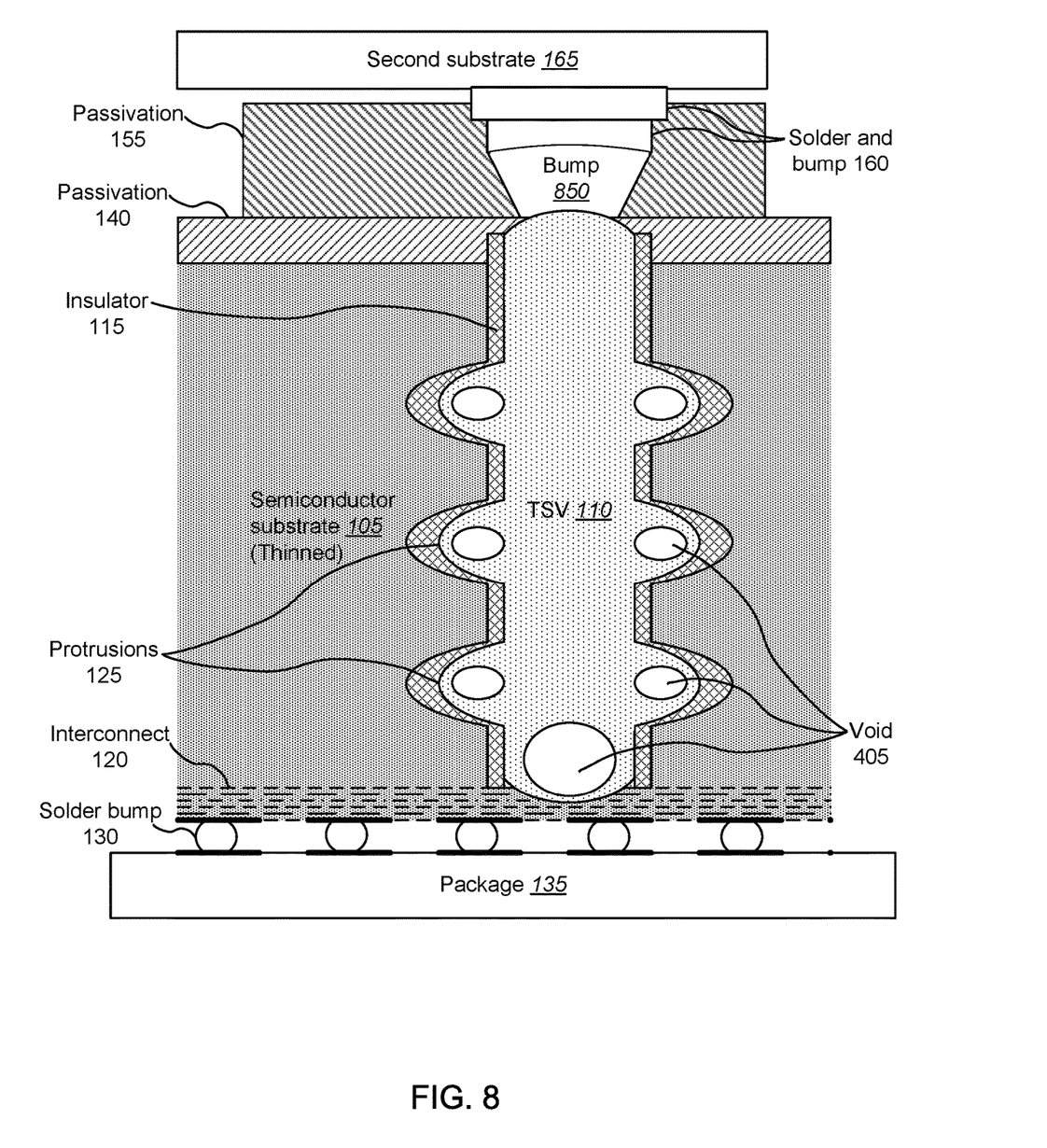
FIG. 8 is a dissected view of a TSV that illustrates the TSV profile and includes protrusions and multiple voids, including a void in each protrusion and a void near to the interconnect.

Although the present description refers to the specific terms of a TSV that is made of Cu, it is understood that the present systems and methods can be applied to various types of electrical connection vias made of various types of conductive materials (e.g., silver (Ag), aluminum (Al), and the like, including various metal alloys). It is further understood that the present systems and methods may be applied regardless of the particular TSV implementation. For example, the present systems and methods may be applied when the TSV stack is implemented with a redistribution layer (RDL layer) or when the TSV stack is implemented without an RDL layer (i.e., the TSV stack is directly under the bump), as illustrated in FIGS. and 8, respectively.

Figure 1:
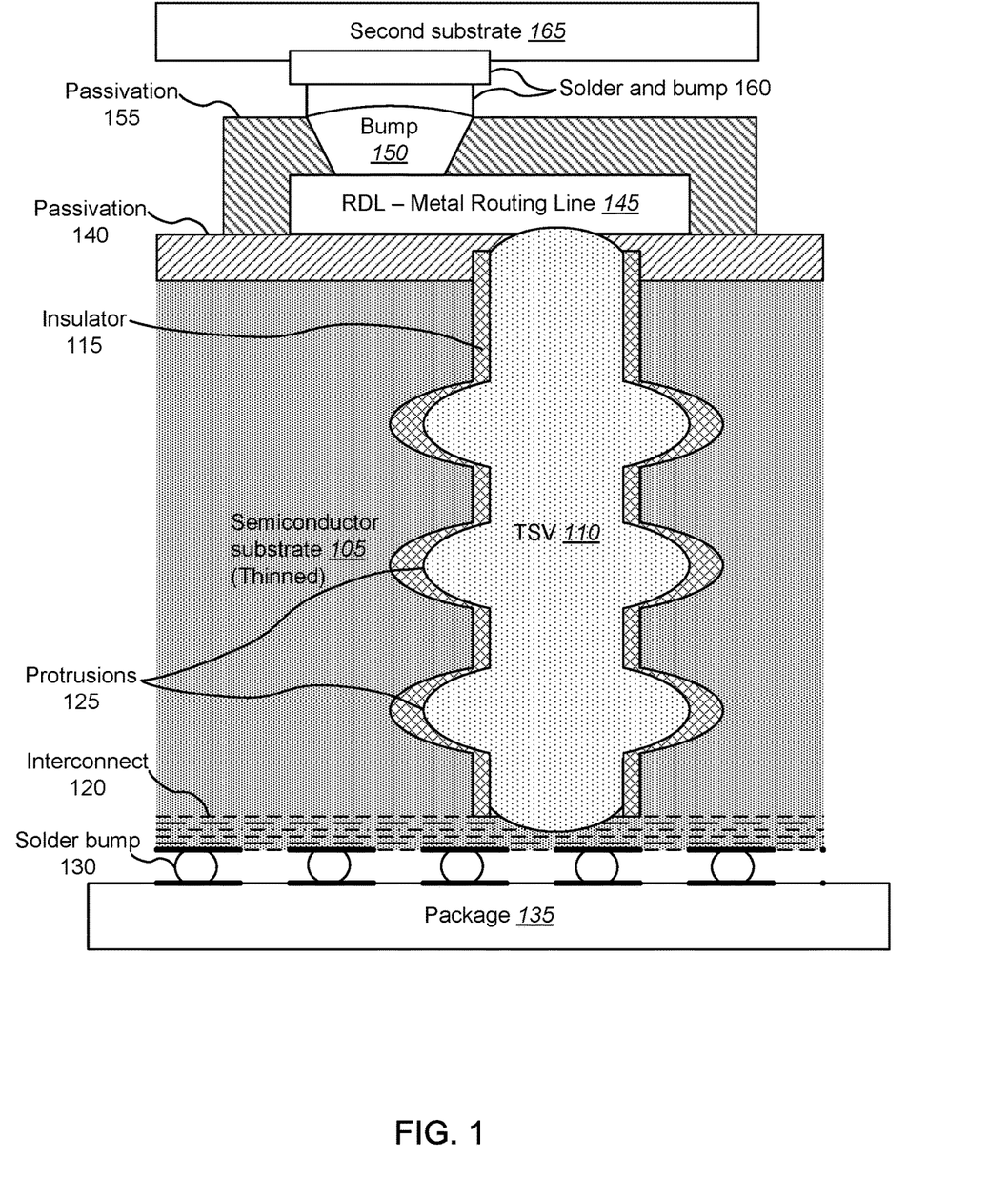
FIG. 1 is a block diagram illustrating one example of an environment in which the present systems and methods may be implemented.

Turning now to the Figures, FIG. 1 is a block diagram illustrating one example of an environment in which the present systems and methods may be implemented. A semiconductor substrate 105 (which has been thinned, for example) includes a TSV 110 for 3D stacking. The TSV 110 enables a first die (and/or wafer) to directly interface with a second die (and/or wafer). Additionally or alternatively, the TSV 110 enables a (stacked) second die (and/or wafer) 165 to be accessed through the package 135.

The semiconductor substrate 105 (e.g., Si substrate) has a front side (that includes the semiconductor elements (i.e., transistors, capacitors, etc.), for example) and a back side. In one example, the interconnect 120 provides access to the semiconductor elements and is associated with the front side of the wafer. The TSV 110 may provide an electrical connection path between the back side of the semiconductor substrate 105 and the interconnect 120. In many cases, the TSV 110 is etched into the semiconductor substrate 105 beginning from the back side, with the TSV 110 landing in the interconnect 120 (at a particular interconnect layer, for example). It is appreciated that this is just one alternative and the scenario could be reversed depending on the specific fabrication process or desired layout.

The TSV 110 may be created during any stage (e.g., TSV first, TSV middle, or TSV last) of semiconductor processing. In any event, a portion of the semiconductor substrate 105 is removed (using etching, for example) to create a hole in the section where the TSV 110 is to be formed and the hole is covered (except for the bottom) in an insulator 115 (e.g., oxide layer) that insulates the TSV material (e.g., Cu) from the surrounding semiconductor substrate 105.

The semiconductor substrate 105 may include a number of input/output pads (on the front side of the wafer, for example) that interface with the package 135 using solder bumps 130. The back side of the wafer is processed for allowing communication to a stacked die. In one example, a layer of passivation 140 (e.g., SiN) is added to the semiconductor substrate 105 and the TSV 110 is coupled to a RDL which couples the TSV 110 to a bump 150 (a logic metal interface or other electrical connection, for example) that couples the TSV 110 the second semiconductor substrate 165 via solder and bump 160. Although the TSV 110 is illustrated as being coupled with an RDL 145, the use of the RDL 145 is implementation specific and in alternative embodiments the TSV 110 may be coupled directly to the bump 150 (and thus the second substrate 165) without the RDL 145. The bump 150 (e.g., a solder bump) is just one example of an electrical connection for connecting between the TSV 110 and the second substrate 165 and it is appreciated that other types of electrical connections may be used without departing from the scope of this disclosure.

The TSV 110 contains a relatively large amount of a conductive material (e.g., Cu). The large amount of conductive material, referred to as Cu hereafter, may experience temperatures during various processing stages (including packaging, for example) that result in thermal expansion of the Cu. As noted previously, this thermal expansion of the Cu historically has created stress around the TSV 110 and most particularly at the interconnect 120 which may result in cracking and/or faults in the area near the TSV 110 in the (high performance/low strength) interconnect 120 (and other nearby areas, for example).

The present systems and methods are directed to reducing stress on the interconnect 120 to prevent the above noted issues (e.g., cracking/faults). In one embodiment, the sidewall of the TSV 110 is varied (controlled variation to create one or more protrusions 125, for example) to allow the stress (processing/thermal expansion/ . . . ) to be carried into the stronger semiconductor substrate 105 rather than into the weaker interconnect 120. In another embodiment, additionally or alternatively, voids are introduced into the TSV 110 (in key locations, for example) to allow the stress to be absorbed in the voids (mitigated) rather than be transferred into the weaker interconnect 120.

Figure 2:
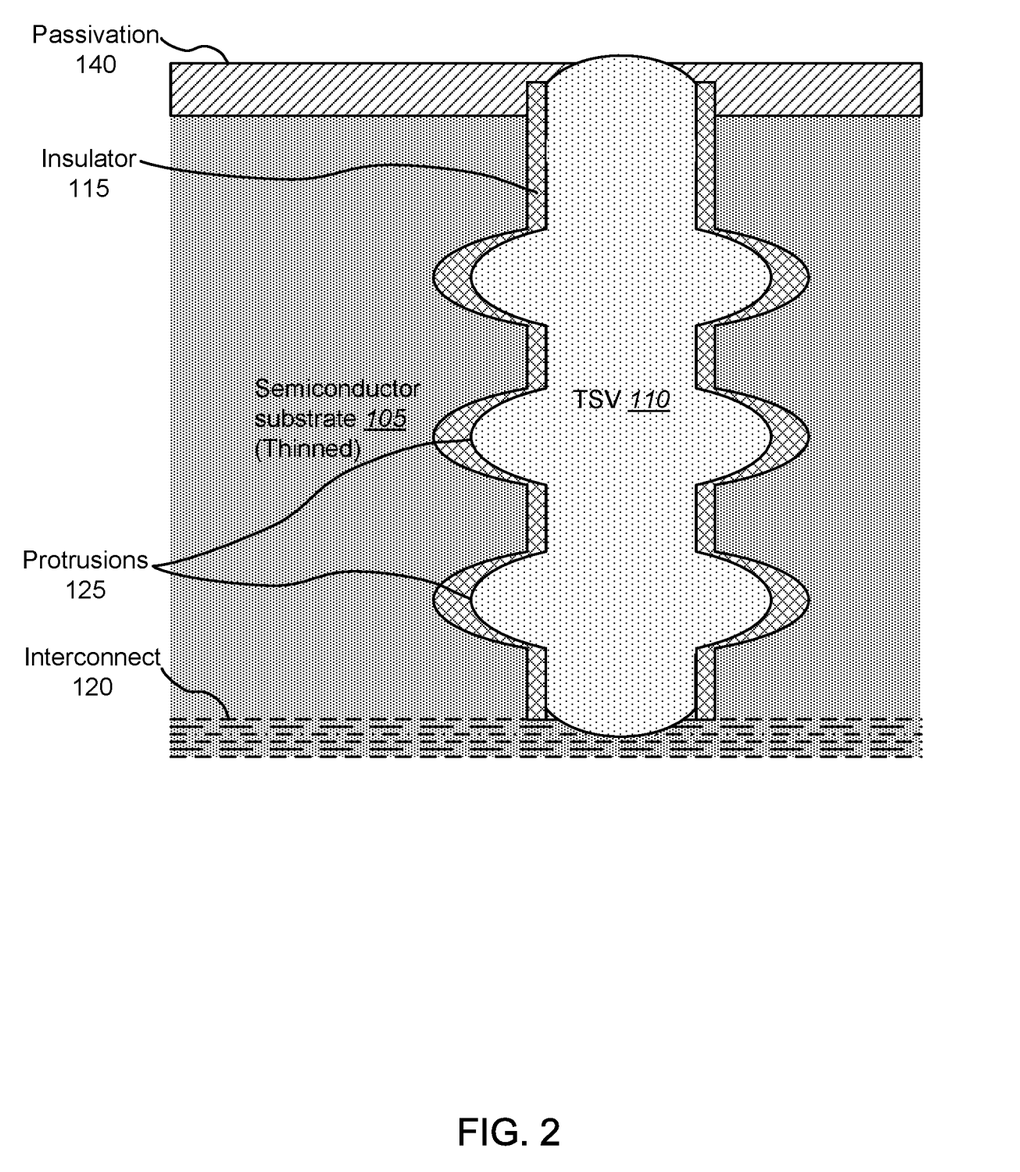
FIG. 2 is a dissected view of a TSV that illustrates the TSV profile including variations in the sidewall.

FIG. 2 is a dissected view of a TSV 110 that illustrates the TSV 110 profile including variations in the sidewall. It is appreciated that, typical TSVs are created with flat sidewalls (e.g., without variation, using regulated etching techniques for example). Such a profile results in very high stress profile on edges (sidewalls and bottom) and in the case of a high performance/low strength interconnect 120, such stress typically leads to cracks/faults in the weak interconnect 120.

In one example, the sidewall of the TSV 110 is varied to include one or more protrusions 125. In one example, protrusions 125 may be created by allowing for more etching to occur in one or more areas than occurs in another area. This variation in the amount of etching creates protrusions 125 (bulges or notches, for example) in the sidewall. In one example, the TSV 110 may be cylindrical in form and a protrusion 125 may be a ring like bulge in the cylinder (the ring like bulge having a larger diameter than the diameter of the cylinder, for example). In yet another example, a protrusion 125 may be localized to one side (a particular portion of the cylinder, for example) of the TSV 110. In either case, the protrusion 125 extends into the semiconductor substrate 105 to change the stress profile associated with the TSV 110.

That is, the sidewall is modified to protrude into the semiconductor substrate 105 effectively increasing the strength of the TSV 110 by using the semiconductor substrate 105 (Si, for example) to contain the stress. The change of the sidewall profile is transparent to the electrical properties but changes the stress profile; therefore, eliminating cracking at the interconnects 120.

TSVs 110 are typically created by etching the semiconductor substrate 105. It is understood that various etching techniques/processes may be used to create a TSV 110. One example of an etch technique is the Bosch Process. It is utilized to create the high aspect ratio via (very narrow yet very tall). The Bosch Process alternates between an isotropic etch and an inert passivation (etch polymer) deposition step and is repeated hundreds of times to create the TSV 110. The two phase process causes the sidewall to scallop at a consistent interval with a specific amplitude. Other etch processes may use similar techniques. In view of this context, the sidewall protrusion 125 as described herein can be potentially created by a number of processes.

In one example, the gas ratio in the TSV etch process (e.g., Bosch process) may be adjusted to reduce the passivation deposition which will allow more notching 125. Then the gas ration may be moved back to again have straight sidewalls. By understanding etch rate, this would allow sidewall modification(s) at any depth required.

In another example, a combination of dry-etch→wet-etch and wet-etch→dry-etch process may be used. The wet-etch process may be used for isotropic etch rates while the dry-etch processes may be used to continue with the straight sidewalls.

In yet another example, a mix of materials having different etch selectivities may be used.

In yet a further example, substrate process charging may be used during etch. As the etch moves closer to less conductive region (e.g., EpiSi on a low Res Substrate) the ion reflection will cause a lateral etch. Then adjust process power/conditions to reduce the charging to resume lateral etch.

It is understood that these are just some examples of how the sidewall of the TSV 110 may be modified to allow for stress reduction.

Figure 3:
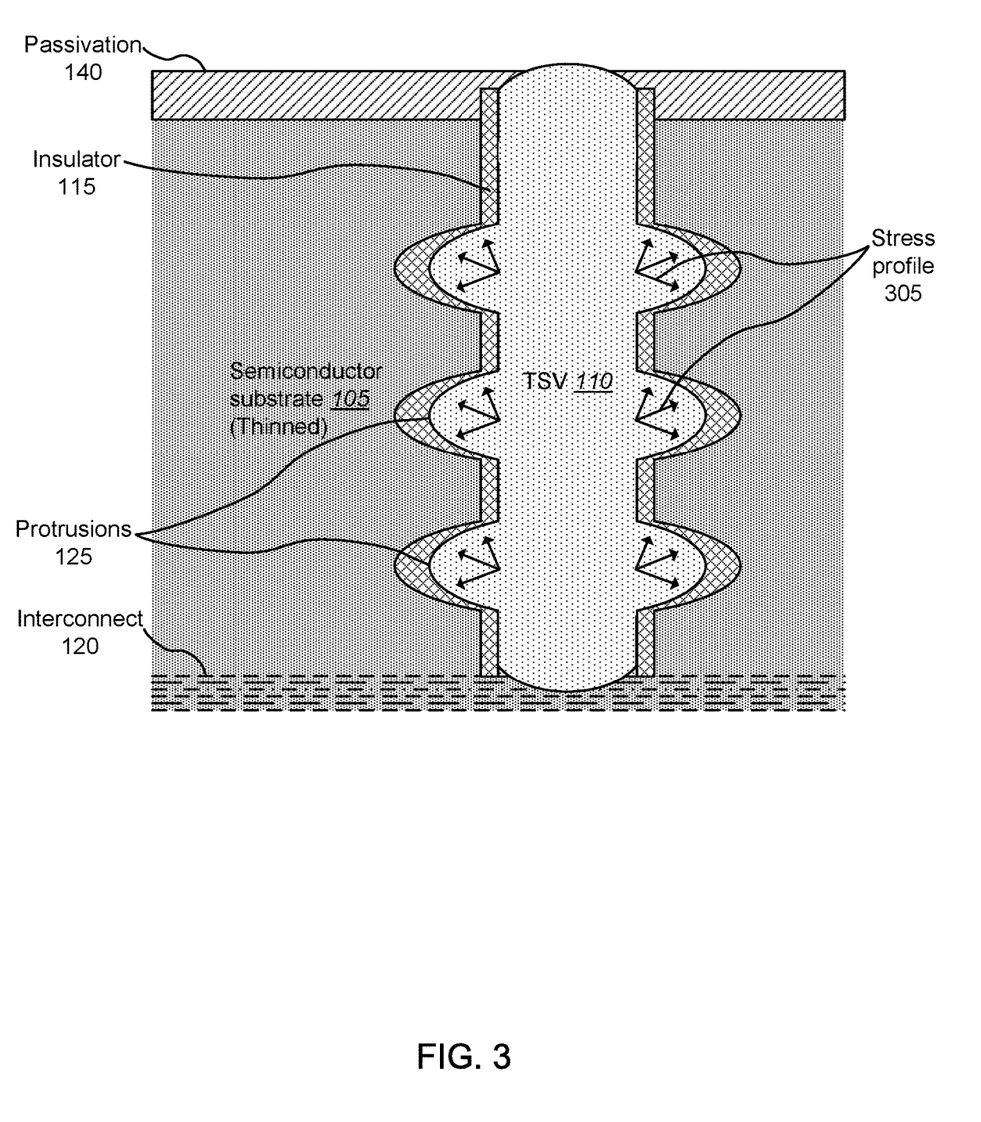
FIG. 3 is a dissected view of a TSV that illustrates the stress profile of a TSV that includes variations in the sidewall.

FIG. 3 is a dissected view of a TSV 110 that illustrates the stress profile of a TSV 110 that includes variations in the sidewall. As described above, the present systems and methods modify the side walls of the TSV 110 such that subsections protrude 125 into (resulting in notches within) the semiconductor substrate 105. These subsections effectively distribute the majority of the stress into the semiconductor substrate 105 and reduce the stress on the interconnect 120. In one example, the protrusions 125 hold the TSV 110 within the semiconductor substrate 105, with the stress profiles 305 applying various directions of force on the semiconductor substrate 105.

Figure 4:
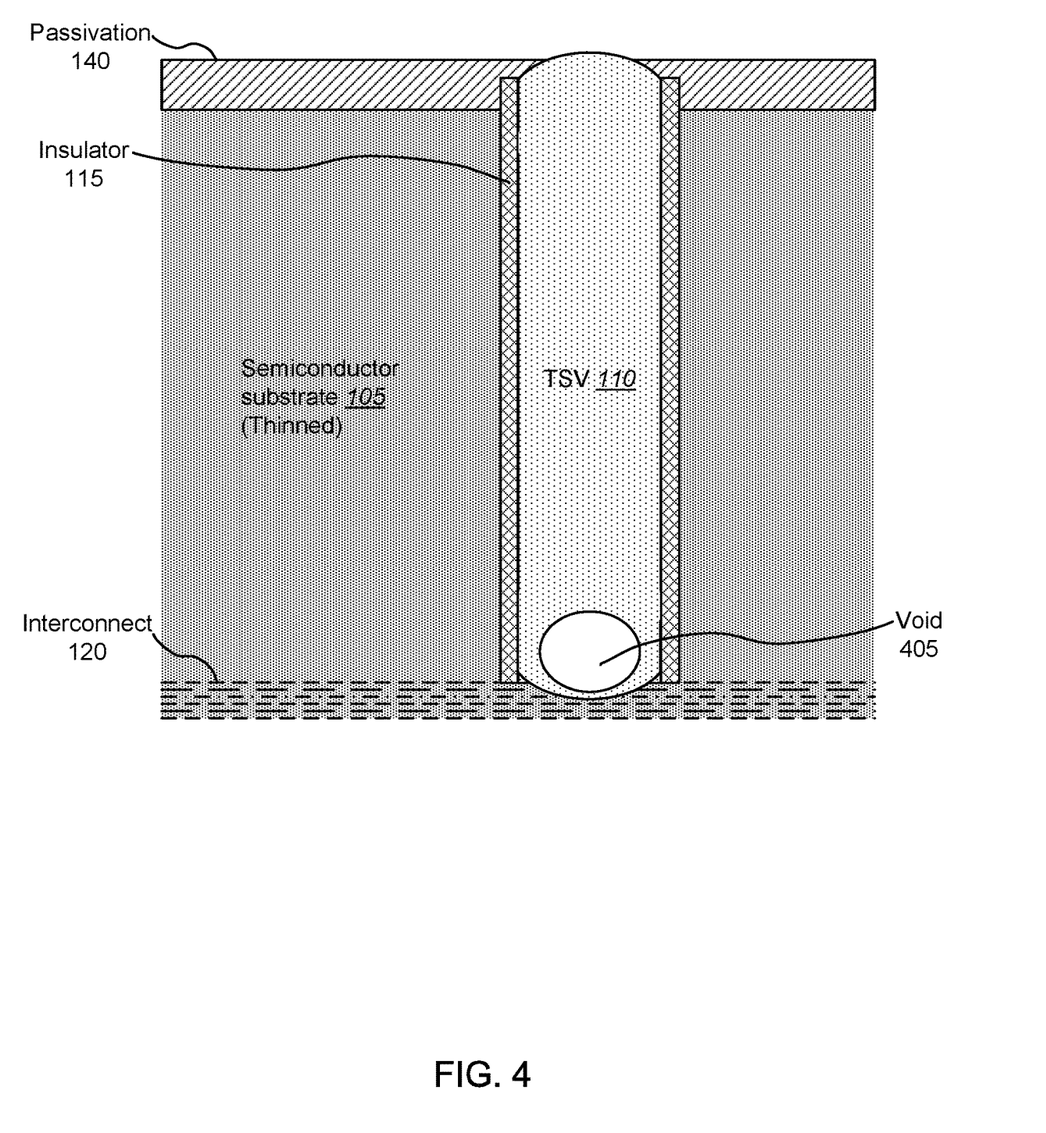
FIG. 4 is a dissected view of a TSV that illustrates the TSV profile and illustrates the inclusion of a void.

FIG. 4 is a dissected view of a TSV 110 that illustrates the TSV 110 profile and illustrates the inclusion of a void 405. It is noted, that the TSV 110 illustrated in FIG. 4 includes flat sides (as is typical for TSVs, for example). The present systems and methods modify the TSV 110 to add a void(s) 405 in the TSV 110 to reduce the interlayer dielectric (ILD) stress (on the interconnect 120, for example) either with or without the modification to the side walls. The void 405 allows Cu to migrate away from high stress areas. That is, the void 405 allows for grain growth and provides a low energy area for the flux of Cu to reduce long term stress.

In one example, the void 405 may be pocket of trapped fluid (a trapped gas (e.g., inert gas), for example). The void 405 may be located in a strategic location to maximize the stress mitigation associated with the void 405. For example, as illustrated, the void 405 may be located at the bottom of the TSV 110 near to the interconnect 120.

Figure 5:
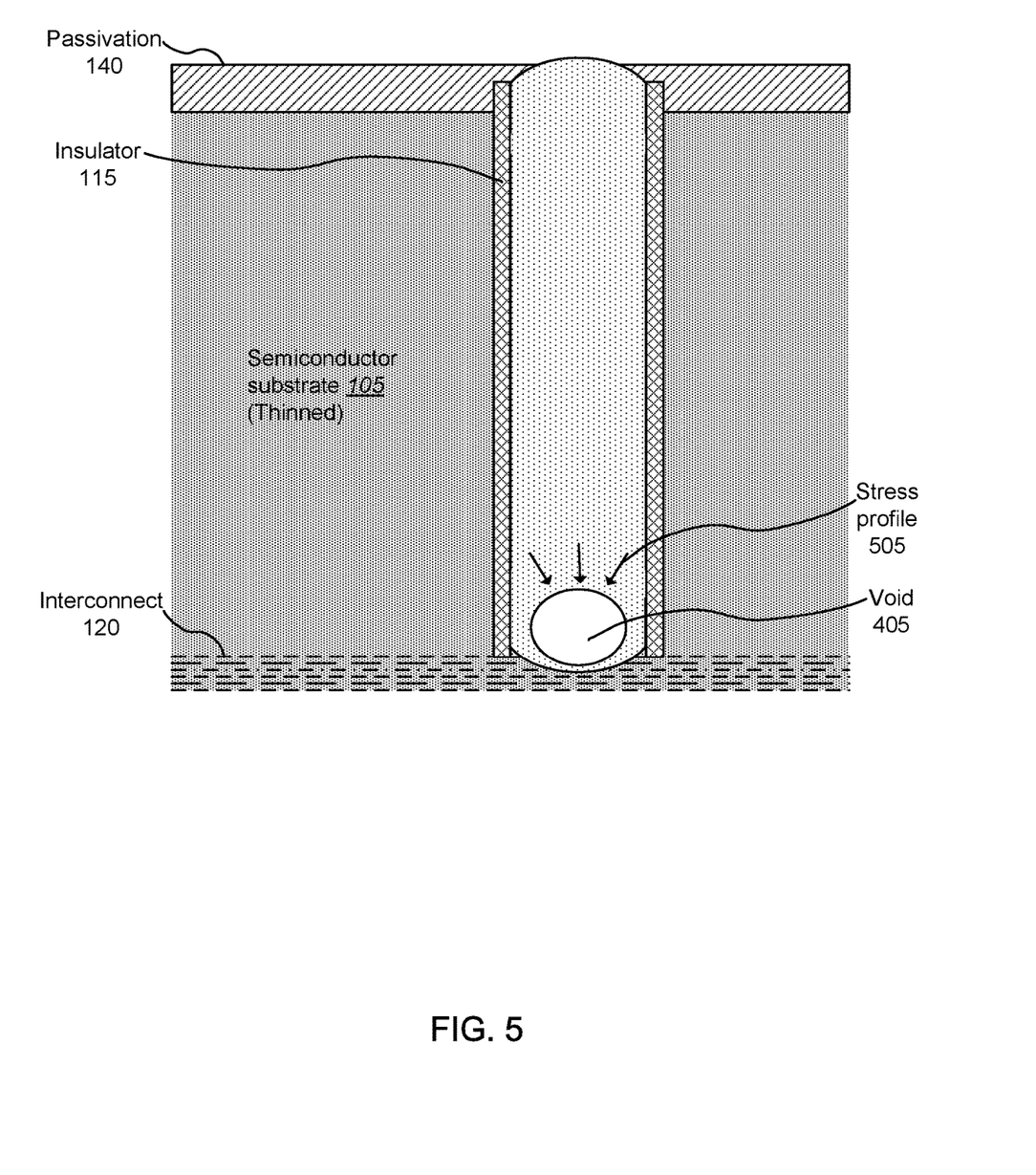
FIG. 5 is a dissected view of a TSV that illustrates the stress profile of a TSV that includes a void.

FIG. 5 is a dissected view of a TSV 110 that illustrates the stress profile of a TSV 110 that includes a void 405. As discussed previously, the void 405 allows for grain growth and provides a low energy area for the flux of Cu to move to. As is illustrated in TABLE 1, below, even a small void 405 may have a significant stress reduction and as the void size is increased the stress continues to be reduced.

TABLE 1

| Max Scaled Stress | High Temp Processing | Residual stress post reflow |
| --- | --- | --- |
| No Void | 125 | 60 |
| Small Void | 90 | 60 |
| Tall Void | 75 | 55 |
| Large Voids | 30 | 10 |

Thermo-mechanical modeling shows voids 405 will reduce the maximum stress at high temperatures and the residual stress post package reflows. In one example, large voids 405 at bottom of the TSV 110 can reduce max stress by a factor of five (5×).

Figure 6:
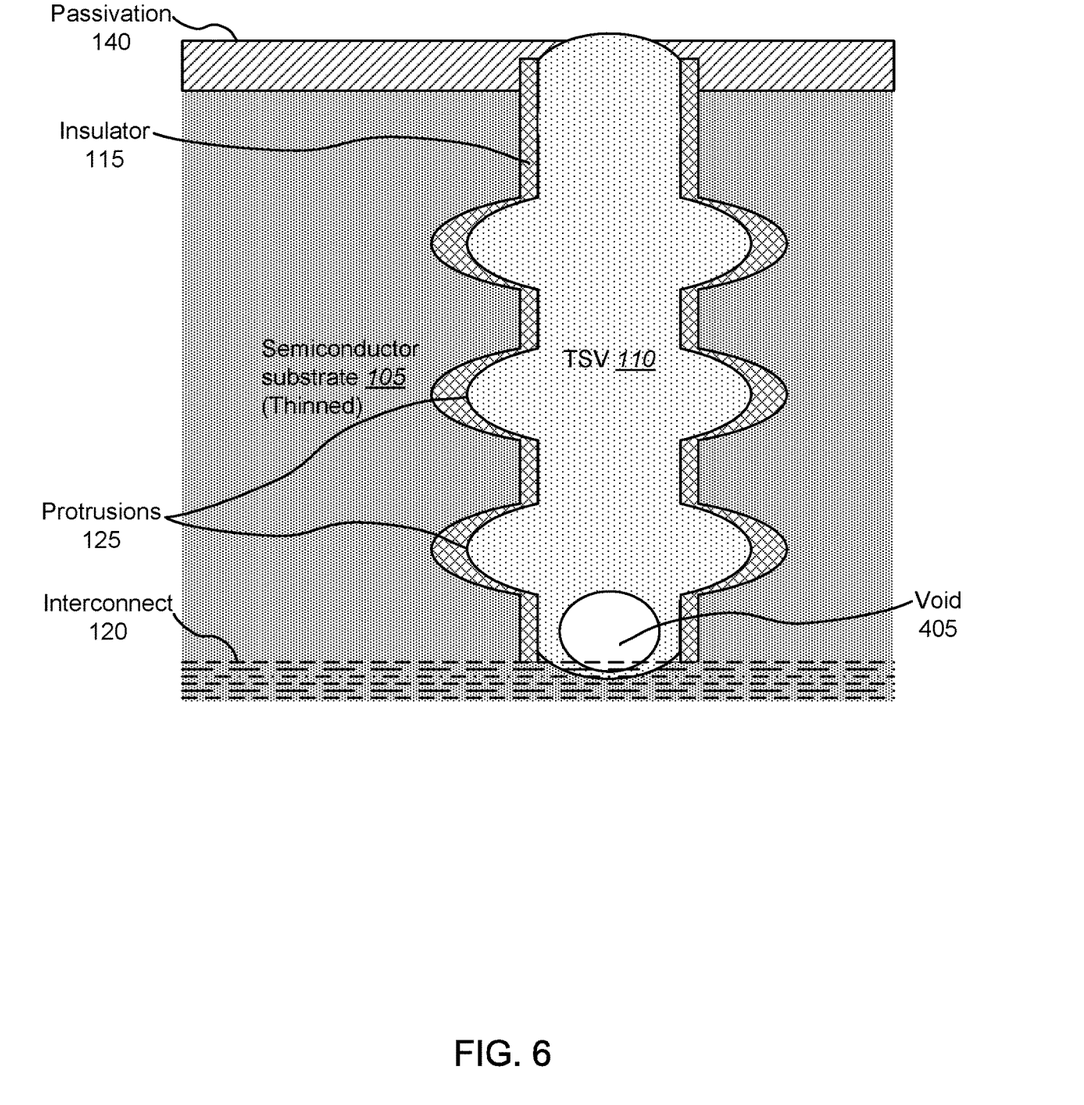
FIG. 6 is a dissected view of a TSV that illustrates the TSV profile and includes protrusions and a void located near the interconnect.
Figure 7:
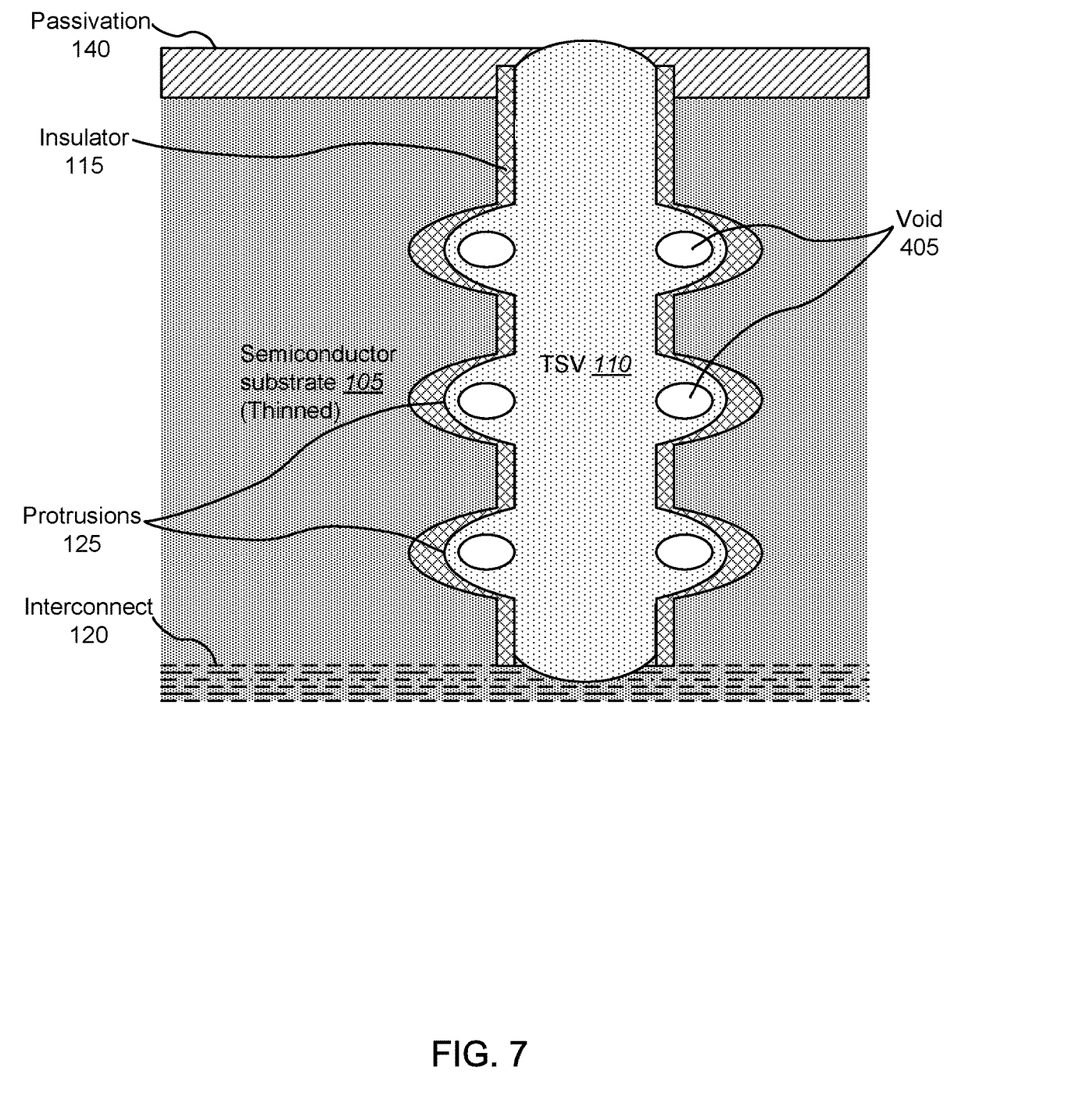
FIG. 7 is a dissected view of a TSV that illustrates the TSV profile and includes protrusions and multiple voids, each located in, or at least partially within, the protrusions.

FIGS. 6-8 illustrate various examples of TSVs 110 that include both protrusions 125 and voids 405. FIG. 6 is a dissected view of a TSV 110 that illustrates the TSV 110 profile and includes protrusions 125 and a void 405 located near the interconnect 120. FIG. 7 is a dissected view of a TSV 110 that illustrates the TSV 110 profile and includes protrusions 125 and multiple voids 405, each located in, or at least partially within, the protrusions 125.

FIG. 8 is a dissected view of a TSV 110 that illustrates the TSV 110 profile and includes protrusions 125 and multiple voids 405, including a void 405 in each protrusion 125 and a void 405 near to the interconnect 120. It is appreciated that the combination of the protrusions 125 and the voids 405 provide synergistic benefits in further reducing stress on the interconnect 120. That is, the benefits of both protrusions 125 and voids 405 may be combined to further reduce/mitigate the stress on a high performance/low strength interconnect 120.

As illustrated in FIG. 8, the systems and methods described herein may also be used without an RDL layer. That is, the TSV 110 (e.g., TSV stack) is directly under the bump 150 (e.g., electrical connection) resulting in a more direct connection with the second die. In one example, having the bump directly on the TSV 110 may add additional stress to the thermal expansion stress. However, as discussed herein, the present systems and methods may transfer stresses into the semiconductor substrate 105 through the use of protrusions 125 and may mitigate stress through the use of voids 405 (strategically placed voids 405, for example).

Figure 9:
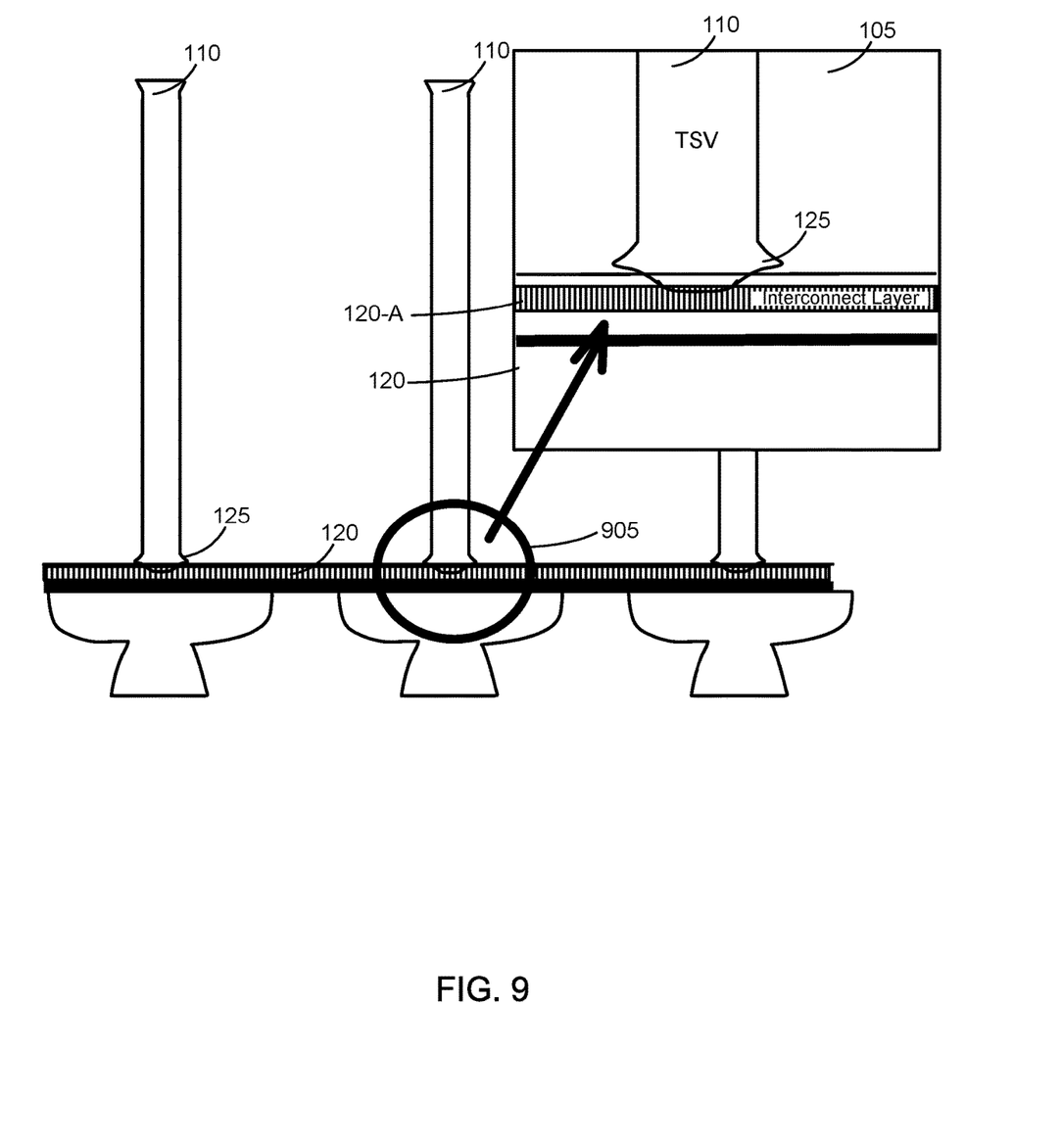
FIG. 9 is a dissected view of numerous TSVs, each having a protrusion.

FIG. 9 is a dissected view of numerous TSVs 110, each having a protrusion 125. As is illustrated in FIG. 9, the protrusion 125 (e.g., notch) may be added right above the interconnect 120. Although only a single interconnect layer 120-A is illustrated, the interconnect 120 may include multiple interconnect layers. For example, it is understood that typically there will be 6+ layers for any high performance product.

The TSV 110 may begin on the back side of the wafer and may land in one of the interconnect layers 120-A of the interconnect 120. As illustrated in FIG. 9, the TSV 110 may land in the first interconnect layer 120-A. A zoomed in image of portion 905 illustrates one example of how the TSV 110 may interface with the interconnect layer 120-A. In one example, the TSVs 110, each with an added protrusion 125 were created using a dry-etch process in Via Last processing.

Figure 10:
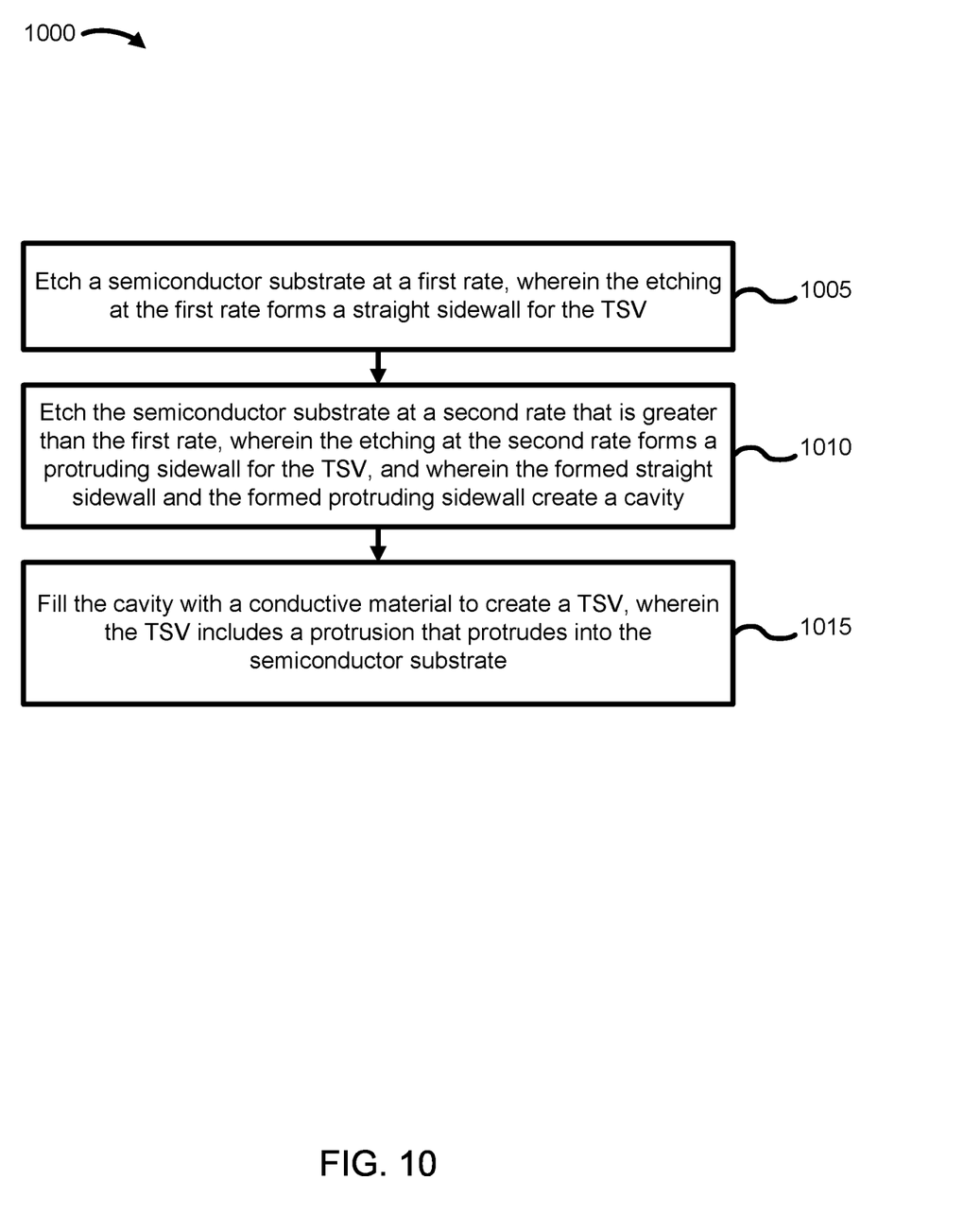
FIG. 10 is a flow diagram of a method for fabricating a TSV.

FIG. 10 is a flow diagram of a method 1000 for fabricating a TSV. The method 1000 may be used to create any of the TSVs 110 illustrated in any of FIGS. 1-9. Although the operations of method 1000 are illustrated as being performed in a particular order, it is understood that the operations of method 1000 may be reordered without departing from the scope of the method.

At 1005, a semiconductor substrate is etched at a first etch rate. The etching at the first rate forms a straight sidewall for the TSV. At 1010, the semiconductor substrate is etched at a second etch rate that is greater than the first etch rate. The etching at the second etch rate forms a protruding sidewall for the TSV. The formed straight sidewall and the formed protruding sidewall create a cavity in the semiconductor substrate. At 1015, the cavity in the semiconductor substrate is filled with a conductive material to create a TSV. The TSV includes a protrusion that protrudes into the semiconductor substrate as a result of the protruding sidewall.

The operations of method 1000 may be managed/controlled by an application specific processor, programmable application specific integrated circuit (ASIC), field programmable gate array (FPGA), or the like.

As described herein, the present systems and methods help enable the use of TSVs 110 in products using low-K (thermo-mechanically weak) interconnects. This applies most directly to Via Last processing (where TSV is process after all other wafer processing steps) but could also be used for Via First and Via Middle processing.

The described systems and methods result in significant stress reduction. While this stress is very difficult to measure directly, the stresses and associated stress reduction may be approximated using modeling. In addition to making TSVs paired with low-K dielectrics functional and reliable; the reduction of stress can enable additional processing steps, such as, high pressure chemical-mechanical planarization (CMP) or adding additional margin for more thermal processing (such as additional packing reflows).

Examples

The following examples pertain to further embodiments.

Example 1 is a semiconductor structure. The semiconductor structure includes a semiconductor substrate and a through-silicon via (TSV). The TSV is disposed between a first surface of the semiconductor substrate and an interconnection layer disposed on a second surface of the semiconductor substrate, where the first surface is opposite to the second surface. The TSV has an external surface that interfaces with the semiconductor substrate. The external surface includes a protrusion that extends into the semiconductor substrate.

Example 2 is the semiconductor structure of example 1 or any of the other described examples, where the protrusion increases the surface area of the external surface.

Example 3 is the semiconductor structure of example 1 or any of the other described examples, where the protrusion transfers thermal expansion stress from the TSV into the semiconductor substrate.

Example 4 is the semiconductor structure of example 1 or any of the other described examples, where the external surface forms a sidewall of the TSV and the protrusion bulges from the sidewall.

Example 5 is the semiconductor structure of example 1 or any of the other described examples, where the external surface of the TSV forms a cylinder and the protrusion forms a ring that protrudes from the cylinder.

Example 6 is the semiconductor structure of example 1 or any of the other described examples, where the TSV includes a void.

Example 7 is the semiconductor structure of example 6 or any of the other described examples, where the void absorbs expansion stress of the TSV.

Example 8 is the semiconductor structure of example 6 or any of the other examples, where at least a portion of the void is located in the protrusion.

Example 9 is the semiconductor structure of example 6 or any of the other described examples, where the void is filled with a compressible fluid and where the compressible fluid is an inert gas.

Example 10 is a semiconductor structure. The semiconductor structure includes a semiconductor substrate and a through-silicon via (TSV). The TSV is disposed between a first surface of the semiconductor substrate and an interconnection layer disposed on a second surface of the semiconductor substrate, where the first surface is opposite to the second surface. The TSV has an external surface that interfaces with the semiconductor substrate. The TSV includes a void.

Example 11 is the semiconductor structure of example 10 or any of the other described examples, where the void absorbs expansion stress of the TSV.

Example 12 is the semiconductor structure of example 10 or any of the other described examples, where the external surface includes a protrusion that extends into the semiconductor substrate.

Example 13 is the semiconductor structure of example 12 or any of the other described examples, where the protrusion increases the surface area of the external surface.

Example 14 is the semiconductor structure of example 12 or any of the other described examples, where the protrusion transfers expansion stress from the TSV into the semiconductor substrate.

Example 15 is the semiconductor structure of example 12 or any of the other described examples, where at least a portion of the void is located in the protrusion.

Example 16 is the semiconductor structure of example 12. or any of the other described examples, where the external surface forms a sidewall of the TSV and the protrusion bulges from the sidewall.

Example 17 is the semiconductor structure of example 12 or any of the other described examples, where the external surface of the TSV forms a cylinder and the protrusion forms a ring that protrudes from the cylinder.

Example 18 is the semiconductor structure of example 10 or any of the other described examples, where the void is filled with a compressible fluid and where the compressible fluid is an inert gas.

Example 19 is a three-dimensional (3D) integrated circuit (IC). The 3D IC includes a first die and a second die. The second die connects with an IC package on a first side of the second die and with the first die on a second side of the second die that is opposite to the first side. The second die includes a through-silicon via (TSV) that connects the first die to at least one of the second die and the IC package. The TSV includes a protrusion that extends into the second die.

Example 20 is the 3D IC of example 19 or any of the other described examples where the second die includes a semiconductor substrate and the protrusion extends into the semiconductor substrate.

Example 21 is the 3D IC of example 20 or any of the other described examples where the protrusion transfers expansion stress from the TSV into the semiconductor substrate.

Example 22 is the 3D IC of example, 19 or any of the other described examples where an external surface of the TSV forms a cylinder and the protrusion forms a ring that protrudes from protrudes from the cylinder.

Example 23 is the 3D IC of example 19 or any of the other described examples where the TSV includes a void.

Example 24 is a method for fabricating a through-silicon via (TSV). The method includes etching a semiconductor substrate at a first rate, where the etching at the first rate forms a straight sidewall for the TSV, etching the semiconductor substrate at a second rate that is greater than the first rate, where the etching at the second rate forms a protruding sidewall for the TSV, the formed straight sidewall and the formed protruding sidewall creating a cavity, and filling the cavity with a conductive material to create a TSV, where the TSV includes a protrusion that protrudes into the semiconductor substrate.

Example 25 is the method of claim 24 where the method includes creating a void within the conductive material. Where the filling the cavity with the conductive material includes filling the cavity so that it includes the created void.

Some of the infrastructure that can be used with embodiments disclosed herein is already available, such as general-purpose computers, mobile phones, computer programming tools and techniques, digital storage media, and communications networks. A computing device may include a processor such as a microprocessor, microcontroller, logic circuitry, or the like. The computing device may include a computer-readable storage device such as non-volatile memory, static random access memory (RAM), dynamic RAM, read-only memory (ROM), disk, tape, magnetic, optical, flash memory, or other computer-readable storage medium.

Although the foregoing has been described in some detail for purposes of clarity, it will be apparent that certain changes and modifications may be made without departing from the principles thereof. It should be noted that there are many alternative ways of implementing both the systems, processes, apparatuses, and methods described herein. Accordingly, the present embodiments are to be considered illustrative and not restrictive, and the disclosure is not to be limited to the details given herein, but may be modified within the scope and equivalents of the appended claims.

Those having skill in the art will appreciate that many changes may be made to the details of the above-described embodiments without departing from the underlying principles of the disclosure. The scope should, therefore, be determined only by the following claims.

The invention claimed is:

1. A semiconductor structure, comprising:
a semiconductor substrate;
a through-silicon via (TSV) disposed between a first surface of the semiconductor substrate and an interconnection layer disposed on a second surface of the semiconductor substrate, the first surface opposite to the second surface, the TSV having an external surface that interfaces with the semiconductor substrate, wherein the external surface includes a protrusion that extends into the semiconductor substrate.

2. The semiconductor structure of claim 1, wherein the protrusion transfers expansion stress from the TSV into the semiconductor substrate.

3. The semiconductor structure of claim 1, wherein the external surface forms a sidewall of the TSV and the protrusion bulges from the sidewall.

4. The semiconductor structure of claim 1, wherein the external surface of the TSV forms a cylinder and the protrusion forms a ring that protrudes from the cylinder.

5. The semiconductor structure of claim 1, wherein the TSV includes a void.

6. The semiconductor structure of claim 5, wherein the void absorbs expansion stress of the TSV.

7. The semiconductor structure of claim 5, wherein at least a portion of the void is located in the protrusion.

8. The semiconductor structure of claim 5, wherein the void is filled with a compressible fluid, wherein the compressible fluid is an inert gas.

9. A semiconductor structure, comprising:
a semiconductor substrate;
a through-silicon via (TSV) disposed between a first surface of the semiconductor substrate and an interconnection layer disposed on a second surface of the semiconductor substrate, the first surface opposite to the second surface, the TSV having an external surface that interfaces with the semiconductor substrate, wherein the TSV includes a void.

10. The semiconductor structure of claim 9, wherein the void absorbs expansion stress of the TSV.

11. The semiconductor structure of claim 9, wherein the external surface includes a protrusion that extends into the semiconductor substrate.

12. The semiconductor structure of claim 11, wherein the protrusion transfers expansion stress from the TSV into the semiconductor substrate.

13. The semiconductor structure of claim 11, wherein at least a portion of the void is located in the protrusion.

14. The semiconductor structure of claim 11, wherein the external surface forms a sidewall of the TSV and the protrusion bulges from the sidewall.

15. The semiconductor structure of claim 11, wherein the external surface of the TSV forms a cylinder and the protrusion forms a ring that protrudes from the cylinder.

16. The semiconductor structure of claim 9, wherein the void is filled with a compressible fluid, wherein the compressible fluid is an inert gas.

17. A three dimensional (3D) integrated circuit (IC), comprising:
- a first die, a second die that connects with an IC package on a first side of the second die and with the first die on a second side of the second die, the second side being opposite to the first side, the second die including a through-silicon via (TSV) that connects the first die to at least one of the second die and the IC package, wherein the TSV includes a protrusion that extends into the second die.

18. The 3D IC of claim 17, wherein the second die includes a semiconductor substrate and the protrusion extends into the semiconductor substrate.

19. The 3D IC of claim 18, wherein the protrusion transfers expansion stress from the TSV into the semiconductor substrate.

20. The 3D IC of claim 17, wherein an external surface of the TSV forms a cylinder and the protrusion forms a ring that protrudes from the cylinder.

21. The 3D IC of claim 17, wherein the TSV includes a void.

22. A method for fabricating a through-silicon via (TSV), comprising:
- etching a semiconductor substrate at a first rate, wherein the etching at the first rate forms a straight sidewall for the TSV;
- etching the semiconductor substrate at a second rate that is greater than the first rate, wherein the etching at the second rate forms a protruding sidewall for the TSV, wherein the formed straight sidewall and the formed protruding sidewall create a cavity; and
- filling the cavity with a conductive material to create a TSV, wherein the TSV includes a protrusion that protrudes into the semiconductor substrate.

23. The method of claim 22, further comprising:
creating a void within the conductive material, wherein filling the cavity with the conductive material comprises filling the cavity so that it includes the created void.

* * * * *